United States Patent [19]

Murano et al.

[11] Patent Number: 5,617,131
[45] Date of Patent: Apr. 1, 1997

[54] IMAGE DEVICE HAVING A SPACER WITH IMAGE ARRAYS DISPOSED IN HOLES THEREOF

[75] Inventors: Shunji Murano, Yokaichi; Kouji Miyauchi, Oumihachiman; Akira Taguchi, Oumihachiman; Kazuhiko Shirao, Oumihachiman, all of Japan

[73] Assignee: Kyocera Corporation, Kyoto, Japan

[21] Appl. No.: 331,354

[22] Filed: Oct. 27, 1994

[30] Foreign Application Priority Data

Oct. 28, 1993 [JP] Japan .................... 5-294468
Nov. 11, 1993 [JP] Japan .................... 5-281569
Nov. 11, 1993 [JP] Japan .................... 5-281570
Nov. 12, 1993 [JP] Japan .................... 5-283013
Dec. 24, 1993 [JP] Japan .................... 5-247438
Feb. 17, 1994 [JP] Japan .................... 6-019752

[51] Int. Cl.$^6$ .................... B41J 2/447; H01L 27/14
[52] U.S. Cl. .................... 347/233; 347/237; 347/238; 347/241; 250/208.1
[58] Field of Search .................... 347/238, 137, 347/132, 130, 244, 242, 241, 237, 233; 250/208.1, 239, 578.1; 358/494; 257/98, 99; 359/819, 821, 808, 811

[56] References Cited

U.S. PATENT DOCUMENTS 3,777,221 12/1973 Tatusko et al. .................... 361/761
4,532,526 7/1985 Behrens et al. ..
4,820,013 4/1989 Fuse .................... 347/238 X
4,821,142 4/1989 Ushifusa et al. .................... 361/739
4,916,464 4/1990 Ito et al. .................... 347/237
4,980,700 12/1990 Ng .................... 347/241
5,005,029 4/1991 Fuse .................... 347/237 X
5,023,442 6/1991 Taniguchi et al. ..
5,321,429 6/1994 Ono et al. .................... 347/238
5,444,520 8/1995 Murano .................... 355/229

FOREIGN PATENT DOCUMENTS 63-217301 9/1988 Japan .................... 359/819

Primary Examiner—Benjamin H. Fuller
Assistant Examiner—David Yockey
Attorney, Agent, or Firm—Loeb & Loeb LLP

[57] ABSTRACT

A plurality of image arrays are sandwiched between a first and a second substrates. The common electrodes of the image arrays are connected to the first substrate; the individual electrodes of the image arrays are connected to the second substrate by flip chip connection. The image arrays are installed in holes of a spacer made by etching a metal plate. Plural lenses are installed in a lens plate made by etching a metal plate; the lens plate is secured to support members for positioning the lenses with respect to the image arrays. The image arrays include a plurality of light elements which may be either light emitter or light receiver elements.

10 Claims, 9 Drawing Sheets

IMAGE DEVICE HAVING A SPACER WITH IMAGE ARRAYS DISPOSED IN HOLES THEREOF

FIELD OF THE INVENTION

The present invention relates to an image device and in particular to an image forming device such as an optical print head and to an image reading device such as an image sensor.

BACKGROUND OF THE INVENTION

Conventional image devices such as an image forming device or an optical print head comprise a lens plate made from resin such as polycarbonate with plural lenses linearly disposed at predetermined regular Intervals, and a base plate made from resin such as polycarbonate with a number of image arrays linearly disposed. Both plates are secured to a pair of supporting bodies so that each lens corresponds to each image array by way of 1:1. Light emitting elements of respective image arrays are individually lit up by feeding external electric signals to cause light beam from the elements to be focused on an external photo sensitive body through one of the lenses for forming a latent image thereon.

Conventionally, each image array incorporates 64 light emitting elements; in the case of an image forming device capable of forming a 200 DPI resolution Image for B-4 size papers, it includes 32 LED arrays or 2048 light emitting elements. And the number of the light emitting elements increases with the resolution of the device. Each LED array has a common electrode on its bottom surface; the common electrode is adhered to a wiring pattern formed on the upper surface of the base plate, for example, by a conductive resinous adhesive agent such as an epoxy resin and silver powder adhesive, and thus the common electrode is electrically connected to the common electrode wiring pattern. Individual electrodes provided on the upper surface of each LED array are electrically connected to individual electrode wiring pattern formed on the upper surface of the base plate with bonding wires. The pattern on the upper surface of the base plate is connected to an external electric circuit; each light emitting elements of respective LED arrays is driven by an external electric signal.

However, since the total number of individual electrodes of the LED arrays of an image device is several thousands, a very long time and care are needed to the wire bonding, thus resulting in the poor productive efficiency and poor yield. Not only such an image forming device, but an image reading device such as an image sensor using a CCD arrays also contains similar defect.

In order to solve those defects, one of the inventors has already proposed an image formation device comprising plural image arrays disposed between a first substrate, provided with common electrode wiring pattern, and a second substrate provided with Individual electrode wiring pattern, (U.S. patent application No. 08/243,948, now U.S. Pat. No. 5,444,520). The second substrate has a window, and the photo sensitive or light emitting elements of the image arrays face the window, wherein the common electrode of each image array is connected to the common electrode wiring pattern of the first substrate and individual electrodes are connected to the individual electrode wiring pattern of the second substrate by flip chip connection. According to the image device, since individual electrodes are connected to the individual electrode wiring pattern by flip chip connection, several thousands of individual electrodes are precisely and solidly connected all at once. Flip chip connection material is, for example, solder.

Nevertheless, erroneous connection easily occurs in the course of connecting the individual electrodes of the image arrays to the individual electrode wiring pattern of the second substrate by the flip chip connection. This is because there are as many as several thousands of individual electrodes, and yet, each electrode is extremely fine, for example, being 50 μm square in size. Furthermore, the image arrays are sandwiched between the two substrates; the individual electrodes are hardly discernible. As a result, the individual electrodes are often connected to pads that do not correspond to the individual electrode wiring pattern.

Furthermore, with respect to the image device, since the width of the second substrate is about 25 times the width of the image arrays for example, in the course of connecting the second substrate onto the image arrays positioned on the first substrate, the second substrate is apt to tilt itself, if the second substrate tilts itself, the reliability and strength of the flip chip connection will be lower, and crack may be generated in upper surface edges of the image arrays. Furthermore, while the image device being used, if any external force is exerted against the first or second substrate, image arrays easily incur damage such as a fissure or crack.

SUMMARY OF THE INVENTION

It is an object of the invention to easily and securely achieve solid electrical and mechanical connection of individual electrodes of respective image arrays to predetermined individual electrode wiring pattern of a second substrate.

It is another object of the invention to correctly position respective image arrays on both a first and a second substrates.

It is another object of the Invention to maintain all of the first substrate, upper surface of the Image arrays, and the second substrate in parallel with each other, for keeping reliability and strength of flip chip connection and for preventing respective image arrays from being damaged by external force.

It is another object of the invention to correctly position the common electrode of each image array on the first substrate by self aligning effect.

It is a still further object of the invention to accurately and easily position lenses.

Other objects of the invention will be more clearly described during the following detailed description.

According to the invention, each electrode of image array is connected by flip chip connection to individual electrode wiring pattern provided on a second substrate, thereby simultaneous connection of a number of individual electrodes to the individual electrode wiring pattern of the second substrate is executed; thus it is possible to manufacture image formation devices inexpensively and effectively. According to the invention, a spacer is disposed between the first and second substrates, and a plurality of image arrays are installed in plural holes provided in the spacer. By virtue of this arrangement, both substrates remain stable without tilting themselves, thus promoting the reliability of the connection and preventing the image arrays from incurring damage otherwise caused by external force. Preferably, the thickness of the spacer is substantially same to that of the image arrays, in order to prevent damage of the image arrays such as crack and fissure from occurring. Furthermore, when the planar size of the holes is arranged to be substantially same to that of the image arrays, the image arrays are accurately positioned by the holes to effectively prevent erroneous connection from occurrence.

The spacer is provided by etching a metal plate for example. In the same way, a plate is provided, which contains correctly perforated holes corresponding to plural lenses produced by etching a similar metal plate. Each lenses is inserted and accurately positioned in each hole; thus the relative positions of the image arrays and the lenses are adequately regulated. Improved accuracy in the positioning of them results in the improved accuracy of latent images formed on the surface of a photosensitive drum, and so on, and also in the improved accuracy of signals read from a document by an image sensor device.

Details of the invention are introduced below. The image array may be an LED array, CCD array, or EL array, for example; a common electrode is set to a main surface of the array, and individual electrodes are set to the opposite main surface of the array. Preferably, connections between the common electrode and common electrode wiring pattern and between the individual electrodes and individual electrode wiring pattern are effected by soldering. When practicable, positioning of the arrays is effected through the self aligning effect of flux In the solder and the solder. For example, in the case of the common electrode connection onto the first substrate, self aligning effect can more effectively be performed by providing the common electrode connection portions of the first substrate with island-like connection portions interconnected by fine patterns. Preferably, the melting temperature of the solder used for the individual electrode connection is equal to or higher than that of the solder used for the common electrode connection. If the two melting temperatures are the same with each other, the two substrates can be connected to the image arrays simultaneously. If the two melting temperatures differ with each other, the second substrate requiring higher accuracy is first connected, followed by the connection of the first substrate.

Each image array corresponds, for example, to a lens based on 1:1 arrangement; preferable lenses are enlargement ones or reduction ones except for actual magnification lenses, for small image arrays are used through the enlargement or reduction. The photo sensitive or light emitting unit, comprising the image arrays and the two substrates, and a lens unit comprising the plural lenses, are mutually accurately positioned with a support member. In order to cut off wrong light passages between the lenses and the image arrays not being corresponding, it is preferable to provide the support member with light shielding plates.

In this specification, assuming that the lens unit is installed at an upper portion and the photo sensitive or light emitting unit is at the lower portion, the upper lower direction and height are specified. As a rule, both the lens unit and the photo sensitive or light emitting unit are of lengthy form, and planes including them are assumed to be horizontal. Each drawing illustrates the lens unit on the upper side in accordance with the above referred arrangement. Most preferably, plural lenses are installed in the corresponding holes of the metal plate, for precise installation of the lenses; however, it is also possible to properly arrange the height of respective lenses by mutually combining the side surfaces of lenses with each other.

DESCRIPTION OF THE PREFERRED EMBODIMENT

Figure 1:
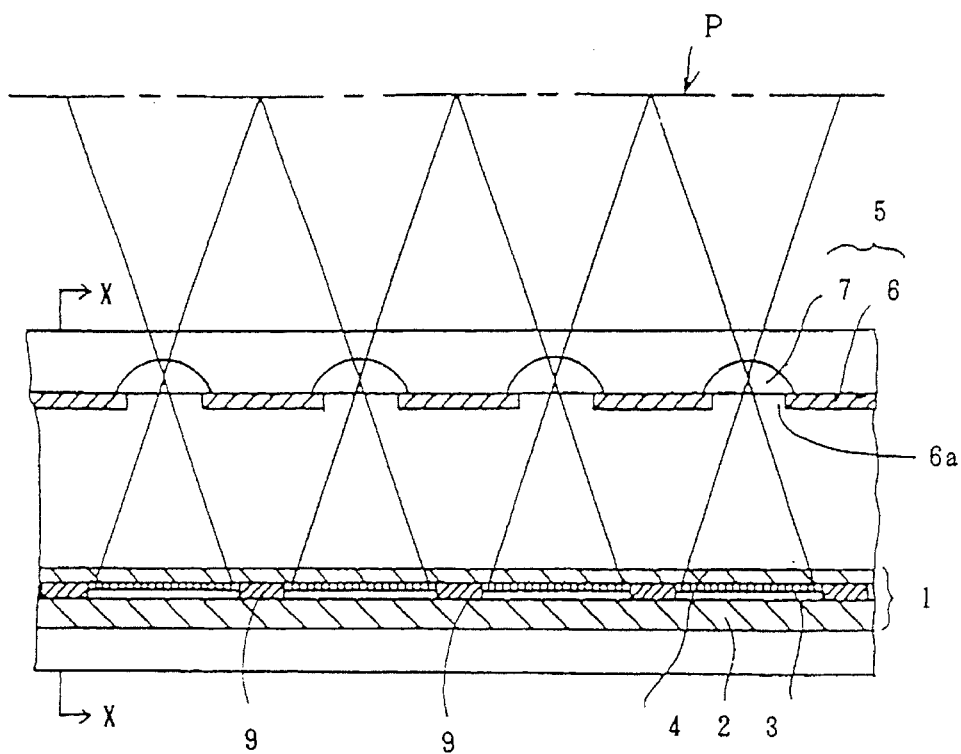
FIG. 1 is a sectional view of an embodiment of the invention related to an optical print head.
Figure 2:
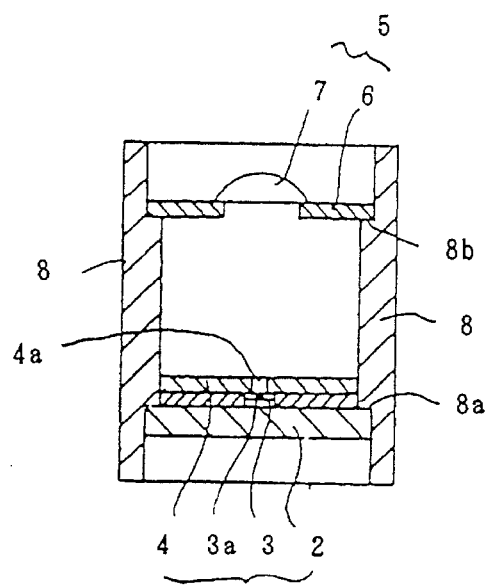
FIG. 2 is a sectional view across line X—X shown in FIG. 1.
Figure 3:
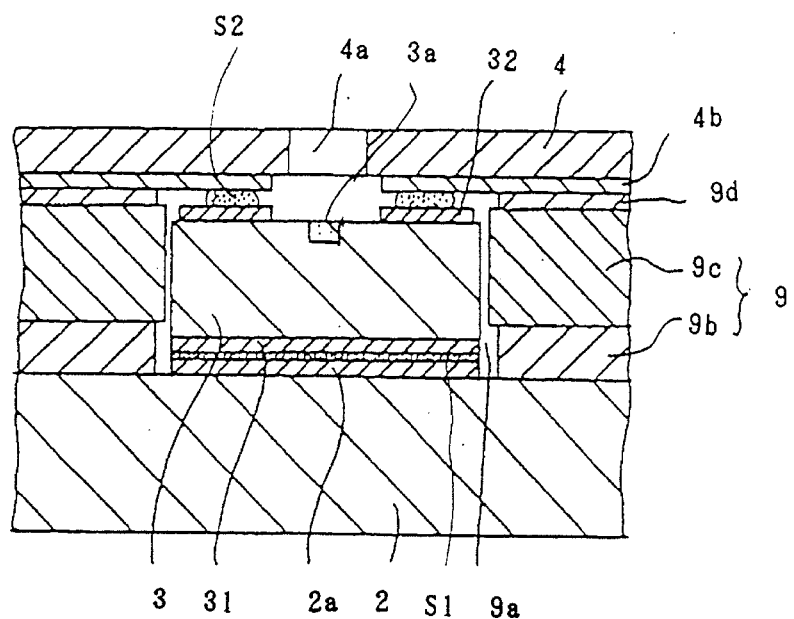
FIG. 3 is an enlarged sectional view in part of the light emitting unit shown in FIG. 1.

FIGS. 1–4 illustrate an embodiment of the invention for an LED print head. The reference numeral 1 designates a light emitting unit, 5 a lens unit, and 8,8 designate a plurality of support bodies. The light emitting unit comprises a first substrate 2, a plurality of LED arrays 3, and a second substrate 4 having a window portion 4a in the center. The first and second substrates 2,4 are respectively composed of a highly rigid material, such as alumina ceramics, crystalline glass, or quartz, that can hardly generate camber or torsion, or made of polycarbonate resin, glass-fiber reinforced resin, or a liquid crystal polymer, for example. On account of the high resistance to generate deformation of the substrates 2, 4, the highly rigid material is desirable; on the grounds of inexpensive cost and easily processable property, use of the polycarbonate resin and glass-fiber reinforced resin is also desirable. On the other hand, because of negligible thermal expansioen coefficient, use of the liquid crystal polymer is also desirable. A plurality of LED arrays 3 are linearly aligned and secured on the upper surface of the first substrate 2. The first substrate 2 supports the image arrays 3, and as shown in FIG. 3, common electrode wiring pattern 2a are previously formed on upper surface of the first substrate 2 according to a predetermined pattern, then, the common electrodes 31 on the bottom surface of the image arrays 3 are connected to the common electrode wiring pattern 2a by solder or a silver paste, for example, by solder S1 in the present case, and the image arrays 3 are linearly aligned and secured on the upper surface of the first substrate 2.

When making the first substrate 2 from alumina ceramics for example, pulverized raw materials such as alumina, silica, calcia, and magnesia, are blended with an organic solvent into a slurry material; the slurry material is formed into a ceramic green sheet by doctor-blade or calendar roll method. The resultant ceramic green sheet is punched out into a predetermined shape; the punched-out ceramic green sheet is sintered at about 1500° C. for example. The upper surface of the first substrate 2 is coated with conductive material such as aluminium or copper of a predetermined thickness by vapor deposition or sputtering for example; the conductive material is etched into a predetermined pattern and plated with nickel or gold into the common electrode wiring pattern 2a.

Each LED array 3 comprises a plurality of light emitting elements 3a which selectively emit light beam in response to external electric signals so that a latent image can be formed on the surface P of an photo-sensitive body by radiating the light beam onto the surface. The light emitting elements 3a consist of GaAsP or GaP LEDs, for example, when they comprise GaAsP LEDs, a substrate of GaAs is heated at a high temperature in a furnace and is brought into contact with vapors containing ASH3, PH3 and Ga to form a GaAsP monocrystal n-type semiconductor on the surface of the substrate. Then, a Si3N4 film with open windows is formed on the surface of the GaAsP monocrystal; vapor of Zn is brought into contact with the windows to dope Zn through the windows for forming a p-type semiconductor. The pn junction at interface between GaAsP and GaAsPZn formed emits light beam. In the case of an LED print head capable of covering a B-4 size printer, 2048 of light emitting elements 3a are required; a total of 32 LED arrays 3, each incorporating 64 light emitting element 3a, are linearly aligned on the first substrate 2.

The second substrate 4 is connected and secured to the upper surface of the LED arrays 3; in order to form light passages from each LED array 3 to a corresponding lens 7, described later, a window 4a of about 100 μm width is formed along the center line of the substrate 2, and individual electrode wiring pattern 4b is formed on the bottom surface of the second substrate 4. Individual electrode 32 of each light emitting element 3a is connected to an external electric circuit through the second substrate 4, and, as shown in FIG. 3, the individual electrode 32 of each light emitting element 3a is connected to the individual electrode wiring pattern 4b formed on the bottom surface of the second substrate 4 by flip chip connection. For example, the second substrate 4 is disposed above the image arrays 3, where individual electrodes 32 are disposed onto the individual electrode wiring pattern 4b and solder bumps are between them; the solder bumps are dissolved by heating for connecting the individual electrodes 32 onto the individual electrode wiring pattern 4b. Thus, several thousands of individual electrodes 32 are simultaneously connected to the corresponding individual electrode wiring pattern 4b electrically without fail and strongly with high productivity and reliability.

When the second substrate 4 is made of an opaque material, a window 4a is provided to form aperture in the center of the substrate 4 so that it serves as light passage between the image array 3 and a corresponding single lens 7. The window 4a is formed by boring the center of the second substrate 4 with laser beam, for example. When the second substrate 4 is composed of a transparent material such as crystalline glass or quartz, the center portion of the used material is used as the window 4a as it is. Individual electrode wiring pattern 4b are formed in the same way as is done for the common electrode wiring pattern 2a.

Figure 4:
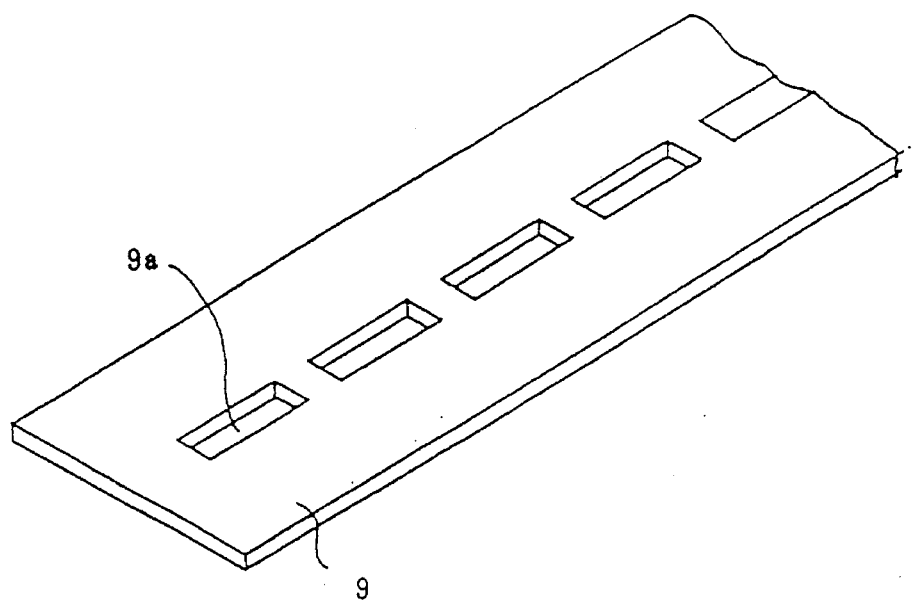
FIG. 4 is a perspective view in part of the spacer shown in FIG. 1.

A spacer 9, shown in FIG. 4, is arranged between the first and second substrates 2, 4 and is provided with a number of through holes 9a for installing the image arrays The spacer 9 has a thickness substantially same to that of the LED array 3, and the planar size of the hole 9a is substantially same to that of the LED array 3. The holes 9a are precisely formed by etching a metal plate for example. By providing the spacer 9, the first and second substrates 2, 4 and all the LED arrays 3 constantly remain in parallel with each other; the solid flip chip connection of individual electrodes of the LED arrays 3 onto the wiring pattern 4b of the second substrate 4 is secured. Furthermore, the spacer 9 prevents the second substrate 4 from bringing damage at corners of the upper surface of LED arrays 3 otherwise caused by depressing force. In the course of connecting the individual electrodes 32 to the corresponding individual electrode wiring pattern 4b by the flip chip connection, the spacer 9 positions the LED arrays 3. Accordingly, the LED arrays being arranged by the spacer 9, individual electrode wiring pattern 4b fit precisely the corresponding individual electrode 32, and thus, all the individual electrodes 32 are easily and securely connected to the predetermined individual electrode wiring pattern 4b by the flip chip connection.

As shown in FIG. 3, the spacer 9 comprises at least double layers consisting of an insulating layer 9b made of an organic film such as a polyester or polyimide film, a paper, or glass, and a metallic layer 9c made of stainless steel, copper, iron, or the like. The insulating layer 9b is arranged on the part of the first substrate 2. When bonding a common electrode 31 to common electrode wiring pattern 2a by solder S1, the insulating layer 9b shields outflow of the solder S1 and secures electrical insulation between adjoining LED arrays 3. If the surface of the individual electrode wiring pattern 4b were not covered with an insulating resist, and if the metallic layer 9c is brought into contact with the individual electrode wiring pattern 4b, the pattern 4b is short circuited by the metallic layer 9c. Therefore, it is desirable that the surface of the metallic layer 9c is covered with the insulating layer 9d consisting of an organic film such as a polyester or polyimide film, a paper, or glass, for example.

The metallic layer 9c is etched for forming a predetermined number of through-holes 9a precisely corresponding to the actual size of the LED arrays 3. Accordingly, in the course of the flip chip connection, all the LED arrays 3 are properly arranged in the corresponding holes 9a; all the individual electrodes 32 are correctly come into contact with the individual electrode wiring pattern 4b provided on the second substrate 4, and thus the flip chip connection is easily and securely done.

Preferably, the spacer 9 has a thickness substantially same to that of LED arrays 3; since when the first or second substrate is subjected to external force that may depress the LED arrays 3, the force does act against the LED arrays 3 for preventing fissure or crack from occurrence.

A lens unit 5 is positioned on the upper portion of the light emitting unit 1 at a predetermined interval. The lens unit 5 comprises a lens plate 6 having linearly aligned through holes 6a and a plurality of lenses 7 positioned into the holes 6a and secured by an adhesive agent. The upper surface of the lens plate 6 supports the lenses 7 at predetermined uniform intervals. The holes 6a respectively make up light passage to the lenses 7. The lens plate 6 is composed of crystalline glass or quartz for example, preferably which is the same material as that of the first substrate 2 for equalizing thermal expansion coefficients between them and preventing positional deviation between the lenses 7 and the image arrays 3 by thermal deformation. The lenses 7 are made from a transparent resin such as an acrylic or polycarbonate resin, or glass and respectively cause light emitted from the light emitting elements 3a to be focused on surface P of a photo sensitive body. All the lenses 7 are bonded onto the lens plate 5, for example, by an epoxy resin adhesive with a part of their surfaces linearly with a predetermined pitch.

The light emitting unit 1 and the lens unit 5 are respectively secured to a pair of support members 8 and 8 so that each LED array 3 corresponds respectively to each lens 7 by way of 1:1 arrangement with a predetermined interval. These support members 8 and 8 are respectively provided with a first reference plane 8b in the upper portions and a second reference plane 8a in the lower portions; the lens plate 6 of the lens unit 5 is positioned in contact with the first reference planes 8b, the first substrate 2 is positioned in contact with the second reference planes 8a, and they are secured thereto. Preferably, the first substrate 2 is made of a highly rigid material, such as alumina ceramics or the like, hardly being subject to deformation, for external force or thermal stress in the course of securing the light emitting unit 1 onto the support members 8 and 8 does not bring deformation such as camber or torsion to the first substrate 2; therefore all the LED arrays 3 are always positioned below the corresponding lenses 7 with extreme precision.

When operating the image device, individual light emitting elements 3a are arranged to selectively emit light by feeding a predetermined power to them; the tight is focused onto the surface P of a photo sensitive body for forming a latent image.

Modification 1

Figure 5:
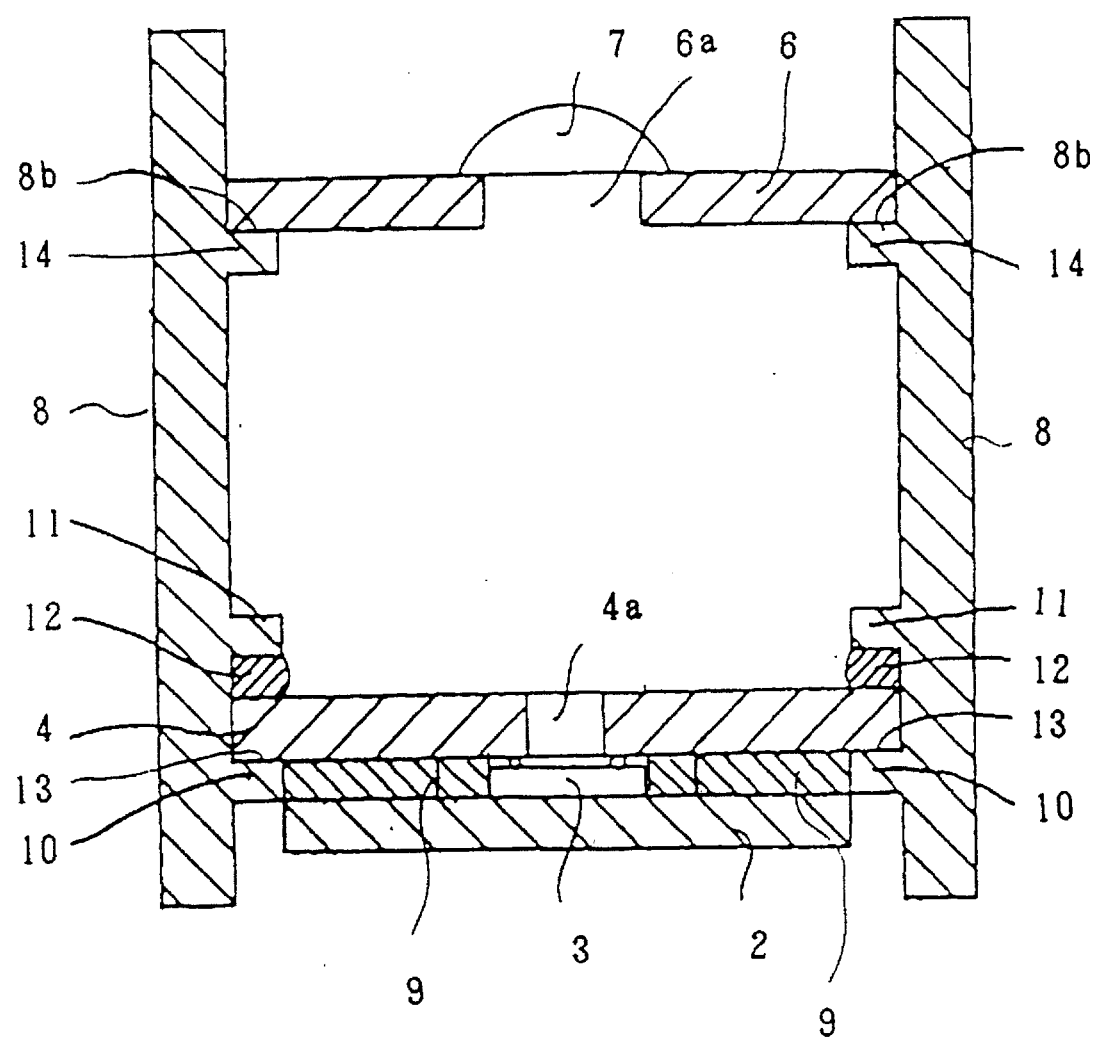
FIG. 5 is a sectional view of a modification.

The above embodiment uses the reference planes 8a and 8a for positioning the light emitting unit 1 to the support members 8 and 8. However, the positions of the surfaces of the LED arrays 3 connected to the second substrate 4, in other words, the positions of the upper surfaces of the LED arrays 3 are actually important. The bottom surface of the second substrate 4 is at the position closest to the upper surfaces of the LED arrays 3. FIG. 5 represents a modification which positions the bottom surface of the second substrate 4 onto the support members 8 and 8. Except for those specifically indicated, the modification 1 are same to those of the above embodiment 1.

Each of the support members 8 and 8 is provided with three projections 10, 11, and 14. The upper surface of the projection 14 makes up the reference plane 8b described earlier, and on the reference plane 8b, the bottom surface of the lens plate 6 is positioned. The upper surface of the projection 10 is reference plane 13 for positioning the lenses 7, and edges of the second substrate 4 and an elastic member 12 are sandwiched between the projections 10 and 11. The elastic member 12 being placed between the projection 11 and the upper surface of the second substrate 4 depresses the bottom surface of the second substrate 4 towards the reference plane 13. The elastic member 12 comprises an elastic material such as rubber, plastics, or a metallic spring, for example; the second substrate 4 can be secured to the support members 8 and 8 merely by Inserting both the substrate 4 and the elastic member 12 between the projections 10 and 11. The elastic member 12 depresses the second substrate 4 towards the reference plane 13; as a result, the bottom surface of the second substrate 4 is positioned at the reference plane 13 and the upper surface of the LED arrays 3 are positioned precisely at the reference plane 13.

Modification 2

Figure 6:
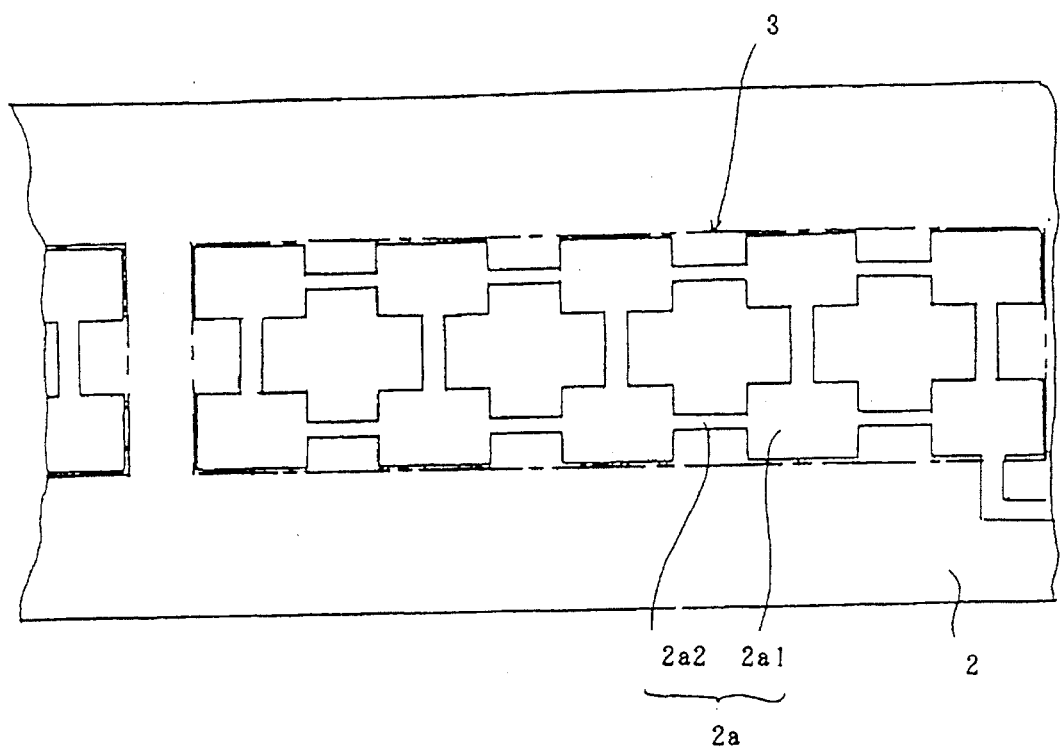
FIG. 6 is a diagram showing a common electrode wiring pattern of the first substrate according to the embodiment.

Another modification 2, shown in FIG. 6, is designed to specifically promote self aligning effect for connecting the common electrode 31 precisely to the common electrode wiring pattern 2a. Plural island like conductive patterns 2a1 are provided for the common electrode wiring pattern 2a at the connect ion port ions; these patterns 2a1 are interconnected through fine connecting patterns 2a2. The patterns 2a1 and the fine connector patterns 2a2 are plated with solder for example; the remaining portions of the connection portions other than the patterns 2a1 and 2a2 are coated with soldering paste or flux, for example. In consequence, when connecting the common electrode 31 to the common electrode wiring pattern 2a with solder, self aligning effect of solder is effected for causing the common electrode wiring pattern 2a and the common electrode 31 to draw on with each other and positioning the LED arrays precisely on the common electrode wiring pattern 2a.

Modification 3

In this modification, the melting temperature of solder bump S2 is equal or higher than that of solder S1. When the two melting temperatures of the solder bump S2 and solder S1 are equal, the solder materials of them are common, as a rule, with each other, and the connection of the LED arrays 3 to both the first and second substrate 2, 4 are simultaneously executed. In this case, owing to retentive force and self aligning effect of the solder bump S2, the solder S1 and their flux, the LED arrays 3 are held on the first and second substrates 2 and 4 at correct positions; the connection of both the common electrode 31 to the common electrode wiring pattern 2a and the individual electrode 32 to the individual electrode wiring pattern 4b is simultaneously executed with treatment in a reflow furnace for example. In consequence, two connection processes are executed at the same time.

When the melting temperature of the solder bump S2 Is higher than that of the solder S1, first, the individual electrode 32 is connected to the individual electrode wiring pattern 4b by the flip chip connection, and then, the common electrode 31 is connected to the common electrode wiring pattern 2a. Owing to the above self aligning effect, the individual electrodes 32 are correctly connected to the individual electrode wiring pattern 4b. Then the common electrode 31 being connected to the common electrode wiring pattern 2a, since the melting temperature of the solder bump S2 is higher than that of the solder S1, the connection already done between the individual electrode 32 and the individual electrode wiring pattern 4b remains unaffected. Therefore, priority is given to the connection between the individual electrode 32 and the individual electrode wiring pattern 4b requiring utmost precision; the several thousands of individual electrodes 32 are connected to the individual electrode wiring pattern 4b without fail.

Modification 4

Figure 7:
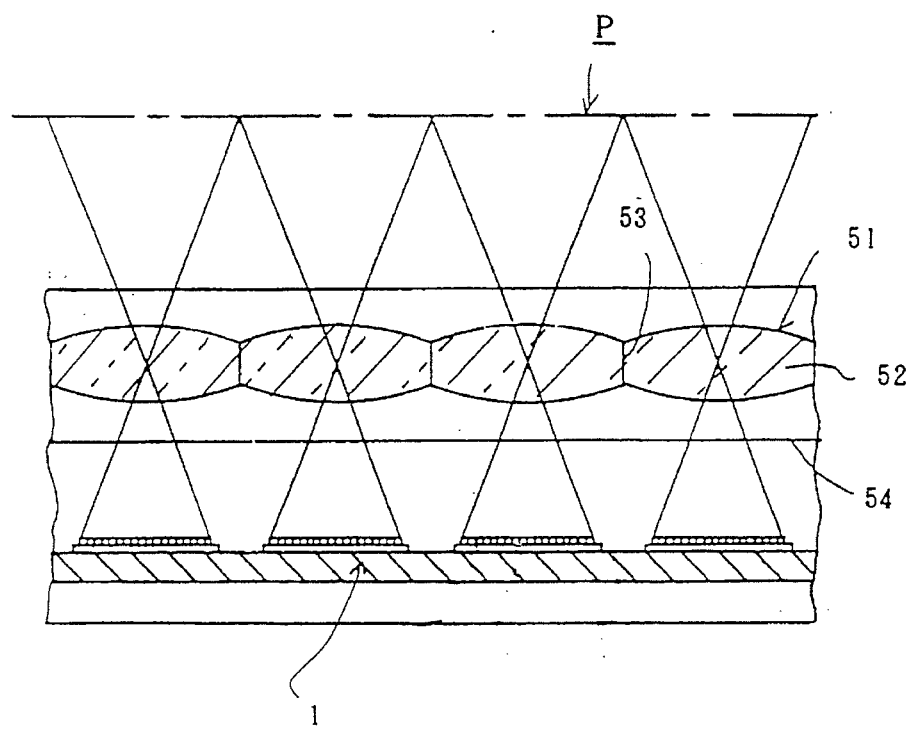
FIG. 7 is a longitudinal directional sectional view of a modified lens unit.
Figure 8:
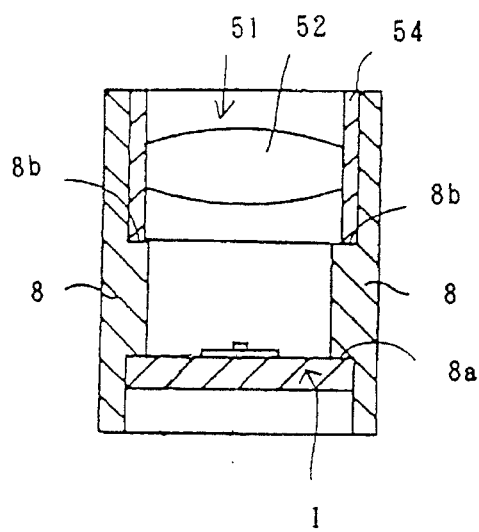
FIG. 8 is a short side directional sectional view of the modified lens unit.

FIGS. 7 and 8 respectively illustrate a modified lens unit 51; the light emitting unit 1 is represented by a simplified structure. The lens unit 51 comprises a number of single lenses 52 corresponding to the image arrays 3 by way of 1:1 arrangement, and each lens 52 has a reference planes 53 on its side surface which extend in a longitudinal direction. The single lenses 52 are, for example, composed of plastics such as a poly-methyl-methacrylate (PMMA) or polycarbonate resin and are formed by Filling a mold having predetermined recesses with the above plastic material liquified; the plastic material is solidified into the lenses. A plurality of the lenses 52 are prepared, the reference planes 53 of respective lenses 52 are bonded together by an adhesive agent, as shown in FIG. 8, the lenses 52 are inserted in a frame body 54, and the resultant is the lens unit 51. Since the lens unit 51 has been formed by connecting the reference planes 53 positioned at a constant height, center positions of all the lenses 52 are identical in height with each other, and the distance between centers of adjoining lenses 52 is identical. Therefore, the optical characteristic of a number of lenses 52 are uniform, and light from the LED arrays 3 is focused without unevenness between lenses 52. Furthermore, each lens 52 has wide aperture diameter to enable light from the LED arrays 3 to be focused clearly and without distortion.

Figure 9:
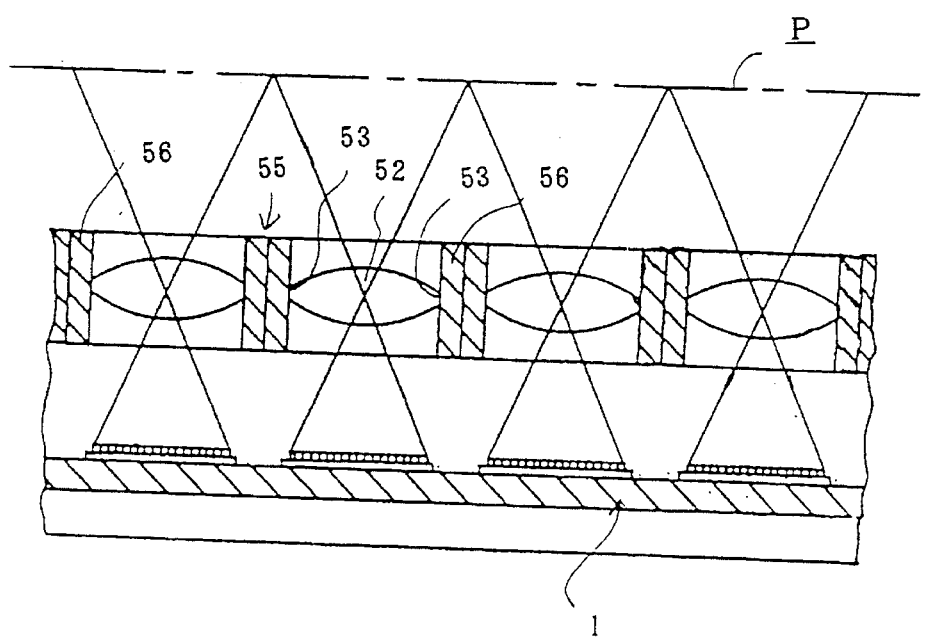
FIG. 9 is a longitudinal directional sectional view in part of another modified lens unit.

The diameter of the lenses 52 may be narrower than the interval of the LED arrays 3, and in that case, as shown in FIG. 9, reference planes 53 are formed on lateral sides of the lenses 52 which are respectively secured to adjoining cylindrical support members 56. The reference planes 53 are positioned into contact with the inner circumference of the cylindrical support members 56. The height of the lenses 52 in the support members 56 being made uniform, a large number of the support members 56 are linearly arranged in contact with each other, and a lens unit 55 is prepared. Also in this case, the horizontal heights of all the lenses 52 are uniform, and the distances between centers of adjoining lenses 52 and 52 are similarly uniform. Accordingly, light from the light emitting elements 3a is focused on the surface P of a photo sensitive body through the lenses 52 for forming a clear and accurate latent image.

When thermal expansion coefficient of the support members 56 of the lens unit 55 is negative, thermal expansion of the lenses 52 is absorbed by thermal contraction of the support members 56 to prevent stress against the lenses 52. In addition, it also prevents positional deviation of the lenses 52 with respect to the LED arrays 3, thus improving their focusing characteristics. The cancel of the stress prevents the lenses 52 from damage and from degradation of focusing characteristics. Liquid crystal polymers have negative thermal expansion coefficients and are suitable for the support members 56.

Addition of a photo absorptive material, for example, pigment into the support members 54 and 56 is effective for the prevention of leakage light from the LED arrays 3 through the support members 54 and 56 which is otherwise incident upon the surface P of a photo sans five body through wrong lenses 52.

Modification 5

Figure 10:
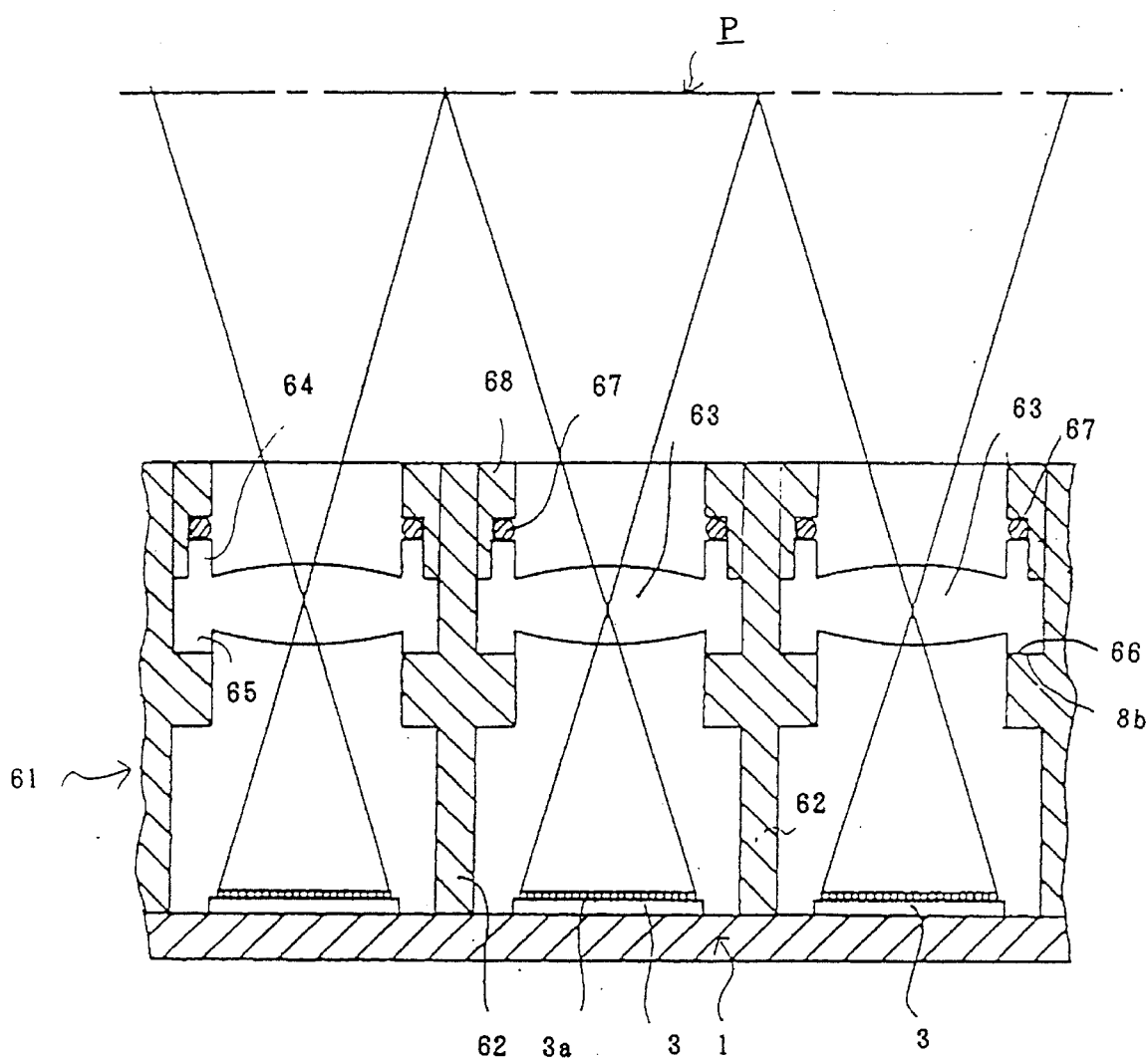
FIG. 10 is a longitudinal directional sectional view in part of a further modified lens.
Figure 11:
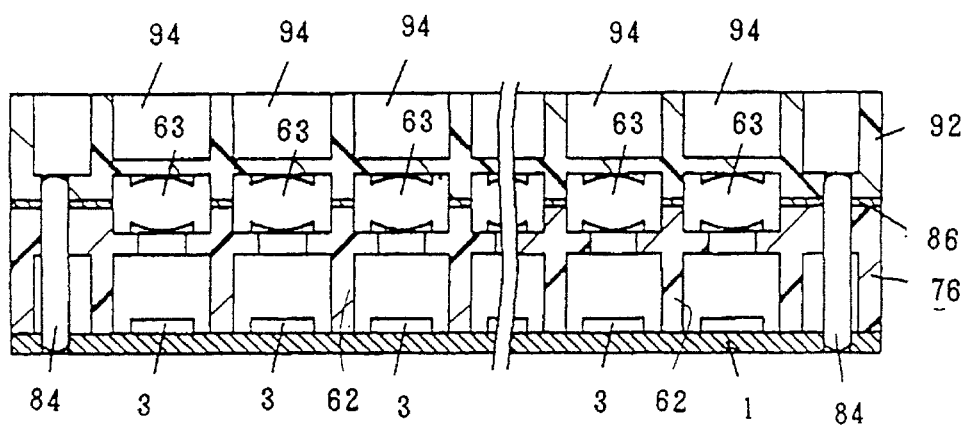
FIG. 11 is a longitudinal directional plan of a 6th modification example.
Figure 12:
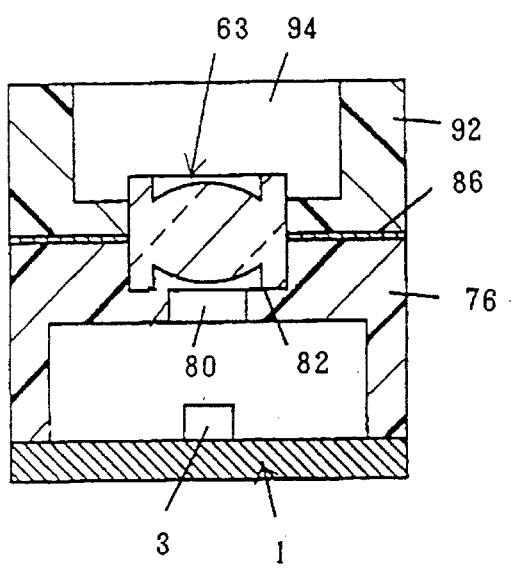
FIG. 12 is a short side directional sectional view of the 6th modification.
Figure 13:
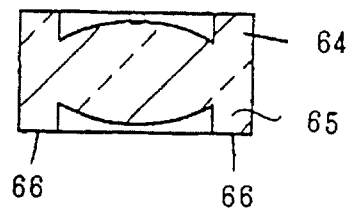
FIG. 13 is a sectional view of an ocellus lens used far the 6th modification.
Figure 14:
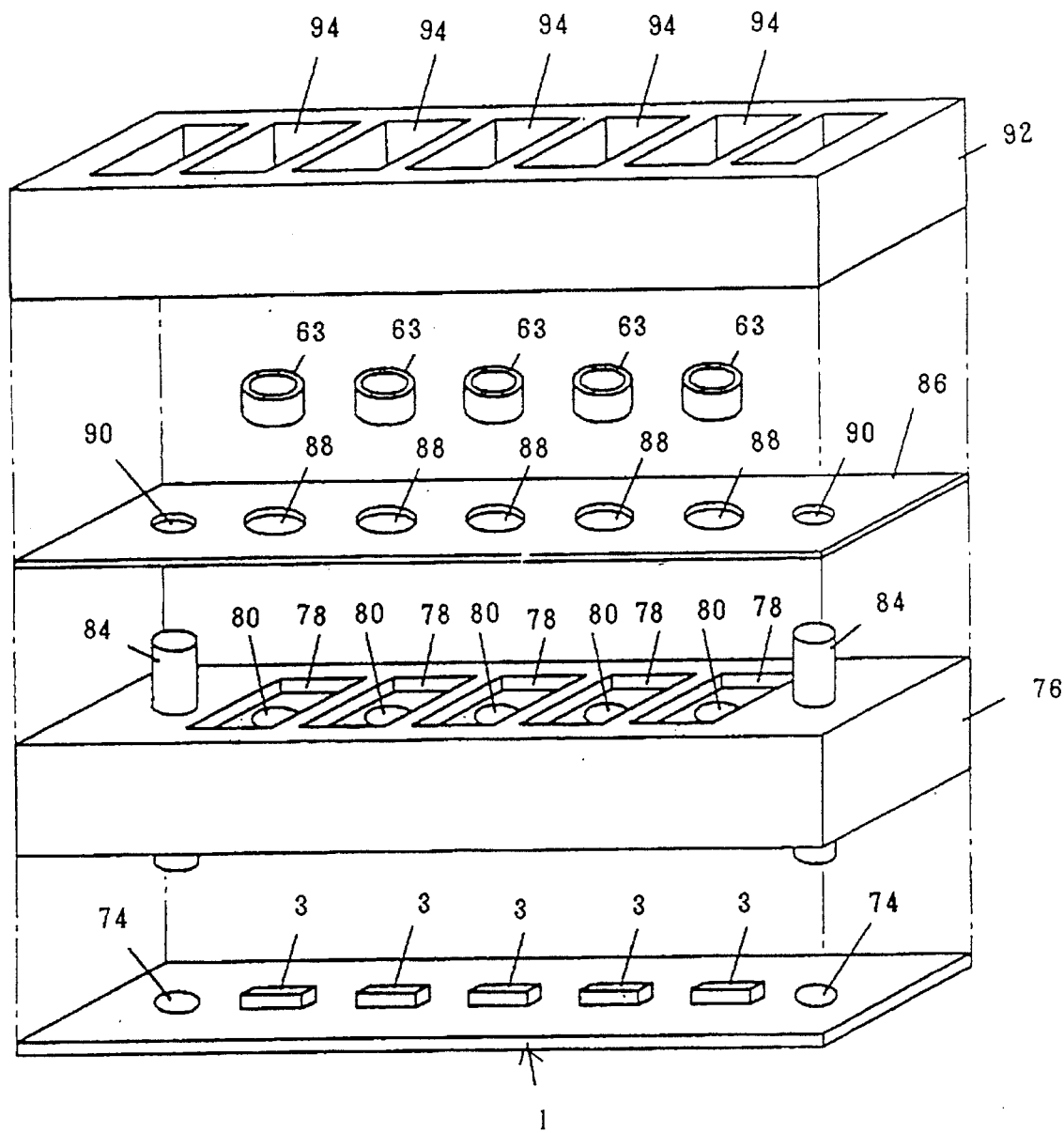
FIG. 14 is a perspective view showing the 6th modification disassembled.

FIG. 10 represents another modification in which precision of setting lenses 63 to support members 61 has been promoted furthermore. Except for specific indications pointed out, the modification is similar to the embodiment shown in FIGS. 1 to 4 and to the above modification 4; the light emitting unit 1 is also shown in a simplified form. The support members 61 are made from polycarbonate resin or the like, preferably being added with pigment so that unnecessary LED light is absorbed and has light shielding plates 62 per LED array 3 to absorb light Incident upon the light shielding plates 62 for cutting off leaked or reflected tight. Like the above embodiment, the lenses 63 are composed of polycarbonate resin or PMMA and are provided with annular projections 64 and 65 at their external circumference. Bottom surfaces of the lower side annular projections 65 make up reference planes 66, and are positioned by applying a reference plane 8b of each support member 61. Each of the upper side annular projections 64 is depressed by an O-ring 67 and a pressing ring 68 to bring the reference plane 65 into contact with the reference plane 8b. As a result, positioning is correctly executed at the reference planes 66 and 8b of respective lenses 63, and the light shielding plates 62 absorb unnecessary light incident from a wrong LED array 3.

Modification 6

FIGS. 11 to 14 illustrate further modification positioning a number of single lenses 63 within 86. The light emitting unit 1 is also shown in a simplified form; except for specific indications pointed out, structural details are same as the embodiment shown in FIGS. 1 to 4. Details of the lenses 63 are shown in FIG. 10.

The first substrate 2 or the second substrate 4 of the light emitting unit 1 contains pin holes 74, and the support members composed of light absorbing plastic are used as lens holders 76 and 92. The lens holder 76 has recesses 78, a through hole 80 at the center of each recess 78, and a reference plane 82 in the periphery of each through hole 80. The reference plane 82 is in contact with a reference plane of the lens 63. The reference numeral 84 designates a pin.

The reference numeral 86 designates a metal plate having about 0.1 mm to 0.5 mm of thickness so that a planar plate with minimal camber is prepared. The metal plate 86 is composed of copper, stainless steel, or aluminium, for example, and when it is more than 0.5 mm In thickness, camber easily takes place, and when it is less than 0.1 mm in thickness, deformation easily occurs resulting in difficulty to achieve flatness. A plurality of through holes 88 and pin holes 90 are formed in the metal plate 86 by etching the plate. The etching forms the through holes 988 more precisely and easily than pressing. The reference numeral 92 designates an upper holder having plural through holes 94.

As shown in FIGS. 1 to 4, the LED arrays 3 are mounted on the substrates 2 and 4 of the light emitting unit 1, when assembling the image device, a plurality of single lenses 63 are inserted in the through holes 88 of the metal plate 80, the upper holder 92 is set as sandwiching the metal plate 86, and the reference plane 66 at the bottom surface of each single lens 63 is in contact with the reference plane 82. Finally, the reference plane 66 is secured to the reference plane 82 with an adhesive agent. The light emitting unit 1, lower holder 76, plate 86, and the upper holder 92 are integrally combined with a pair of pins 84 and 84.

Since the through holes 88 of the metal plate 86 are formed by an etching process, their shape precision is very high. Likewise, lateral surfaces of the annular projections 64 and 65 are precisely formed by a mold used for the formation of the lenses 63. Thus, when inserting the single lenses 63 in the corresponding through holes 88, the lenses 63 are precisely positioned in the horizontal direction in the drawing. The single lenses 63 are depressed by the upper holder 92, and each reference plane 8 is brought into contact with the reference plane 82 of the recess 78. As a result, the single lenses 63 are precisely positioned in the vertical direction in the drawing, therefore the single lenses 63 are correctly positioned in both the horizontal and vertical directions. The metal plate 86 is coupled with the substrates 2 and 4 of the light emitting unit 1 by means of the pins 84, and all the single lenses 63 are correctly mounted above the corresponding LED arrays 3. The single lenses 63 are mounted at less than +/−5 μm of error; therefore, if magnifying light from the LED arrays 3 double, image quality are prevented from degradation.

If the metal plate 86 deforms itself due to ambient temperature variation or heat generated by the LED arrays 3, focusing capability lowers. In particular, since image is formed by magnifying light from the LED arrays 3 through the single lenses 63, if the single lenses 63 shift their positions by more than 5 μm with thermal deformation, white or black streak will be generated at positions corresponding to intervals between respective LED arrays 3. However, thermal expansion coefficients of metals are generally rated to be 1 to $2\times10^{-5}$/°C., which are lower than thermal expansion coefficients of plastic materials rated to be 5 to $7\times10^{-5}$/°C., therefore, with horizontal directional position of the single lenses 63 being determined by means of the metal plate 86, image quality can be prevented from thermal degradation. According to this modification, since the metal plate 86 is sandwiched between the holders 76 and 92, heat transmitted to the metal plate 86 from the single lenses 63 are further transmitted to the holders 76 and 92 so that thermal deformation is minimized.

Modification 7

Figure 15:
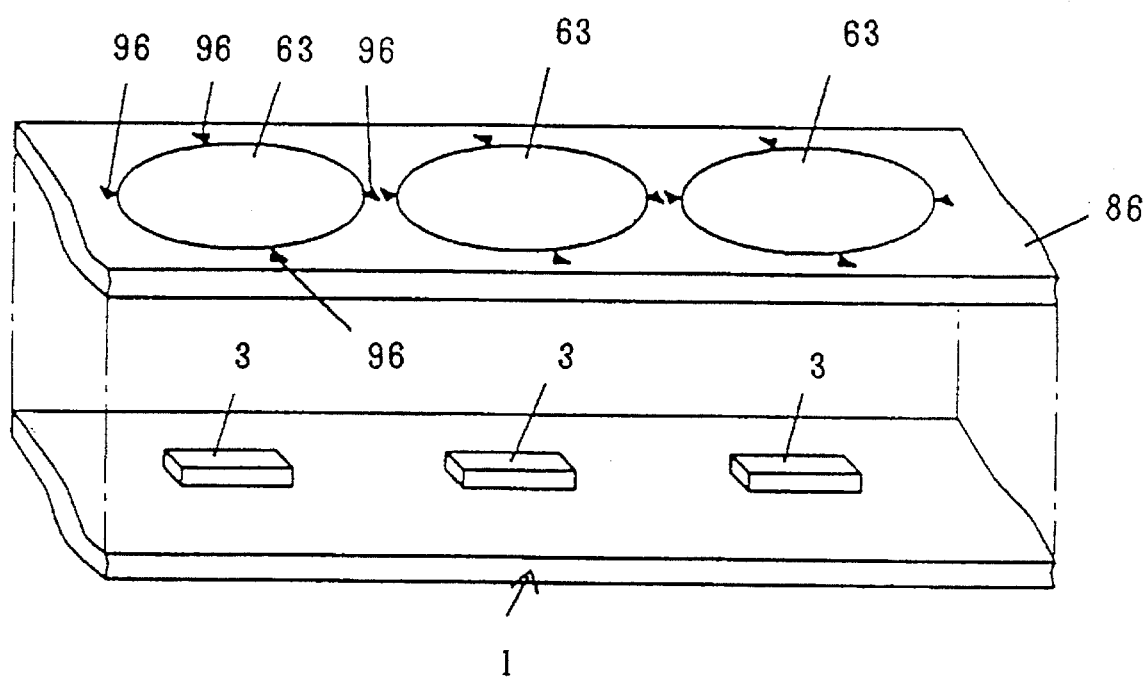
FIG. 15 is a perspective view of the 7th modification disassembled.

FIG. 15 illustrates a further modification of the Invention, capable of confirming actual positions of the single lenses 63 and the LED arrays 3. Except for specific indications, structural details are identical to those of the above modification shown in FIGS. 11 through 14. The light emitting unit 1 is shown in a simplified form. When the second substrate 4 is transparent, the LED arrays 3 and the peripheral individual electrode wiring pattern 4b are visible through the lenses 63. Even if the second substrate 4 is opaque, they are thin in thickness, and the LED arrays 3 and the Individual electrode wiring pattern 4b are also visible. In this modification, for example, four marks 96 are provided in the periphery of the lens mounting positions on the metal plate 86, for checking the lenses after assembling the image device. For example, an image cognition device is used for checking the mounted lenses, comparing the center positions of the four marks 96 with the center positions of each lens 63. Then the cognition device seeks the four vertex positions of the LED arrays 3, and if the image arrays 3 are observed obscurely, its calculate the vertex positions indirectly from the individual electrode wiring pattern 4b. When the lenses 63 and the LED arrays 3 are correctly mounted, the centers of four marks 96 match both the centers of each lens 63 and the center of each LED array 3. If a lens 63 or an LED array 3 is incorrectly set, then the four vertexes of each LED array 3 are asymmetrically distributed around the center sought from the four marks 96. For example, assuming that a lens 63 is improperly mounted, since the LED arrays 3 are observed from an inappropriate angle, four vertexes of the LED array 3 are asymmetric around the centers of the four marks 96. The Image cognition device seeks the four vertex positions and checks whether they are symmetric or not, comparing them with the center of the four marks 96. In this way, it is possible to easily confirm whether the lenses 63 and the LED arrays 3 are correctly mounted or not.

It should be understood that the scope of the invention is not limited to the above embodiment and variations. For example, a self focussing lens array is usable in place of the single lenses 7, and CCD arrays may be usable in place of the LED arrays for providing an image reading device such as an image sensor.

What is claimed is:

1. An image device comprising:

a lens unit comprising a plurality of lenses, a light unit, and a support member supporting the lens unit and the light unit, the lens unit and the light unit being substantially mutually parallel, the light unit comprising:

a first substrate having a common electrode wiring pattern, a second substrate having an individual electrode wiring pattern, a plurality of image arrays disposed on the first substrate between the first substrate and the second substrate, each of the plurality of image arrays comprising:

a first surface, a second surface, a plurality of light elements on the first surface, each of the plurality of light elements comprising one of a light emitter and a light receiver, a plurality of individual electrodes connected to the light elements and connected to the individual electrode wiring pattern by flip chip connection, a common electrode on the second surface of the image array, the common electrode being connected to the common electrode wiring pattern, the second substrate having a light passage window facing the plurality of light elements, and a plate-like spacer comprising a metallic layer having two main surfaces and insulating layers laminated on both of the two main surfaces, the spacer being disposed between and connected to the first substrate and the second substrate and having a plurality of holes in which the plurality of image arrays are received.

2. The image device of claim 1, wherein the plurality of image arrays have a common thickness, and wherein the spacer has a thickness substantially equal to the common thickness of the plurality of image arrays.

3. The image device of claim 1, wherein each of the plurality of holes of the spacer defines a first three dimensional volume, each of the plurality of image arrays defines a second three dimensional volume, and the first and second three dimensional volumes are substantially equal in size.

4. The image device of claim 1, wherein the common electrode wiring pattern comprises a plurality of island-like conductive regions and a plurality of connecting regions interlinking the island-like conductive regions.

5. The image device of claim 1, comprising:

a first solder having a first melting temperature connecting the individual electrodes to the individual electrode wiring pattern, a second solder having a second melting temperature connecting the common electrodes to the common electrode wiring pattern, the first melting temperature being higher than the second melting temperature.

6. The image device of claim 1 wherein the support member comprises:

a plurality of first projections in contact with a surface of the second substrate, a plurality of second projections disposed between the second substrate and the plurality of lenses, and a plurality of elastic members disposed between the second projections and the second substrate.

7. The image device of claim 4, wherein each of the plurality of image arrays is aligned with a corresponding one of the plurality of lenses, the plurality of image arrays are linearly disposed at predetermined intervals between the first substrate and second substrate, and the support member includes at least one light shielding plate for shielding passage of light between at least one of the plurality of image arrays and at least one of the plurality of lenses with which the at least one image array is not aligned.

8. The image device of claim 6, wherein each of the plurality of lenses has a reference plane extending in a longitudinal direction, and wherein the reference plane of at least one of the plurality of lenses is connected to the reference plane of at least another one of the plurality of lenses.

9. The image device of claim 6, wherein each of the plurality of lenses includes a circumferential surface and wherein the circumferential surface of each of the plurality of lenses is in contact with the support member.

10. An image device comprising:

a lens unit comprising a plurality of lenses, a light unit, and a support member supporting the lens unit and the light unit, the light unit comprising:

a first substrate having a common electrode wiring pattern, a second substrate having an individual electrode wiring pattern and a transparent window, and a plurality of image arrays disposed on the first substrate between the first substrate and the second substrate, each of the plurality of image arrays comprising:

a first surface, a second surface, a plurality of light elements on the first surface, each of the plurality of light elements comprising one of a light emitter and a light receiver, a plurality of individual electrodes, the plurality of individual electrodes being connected to the plurality of light elements and being connected to the individual electrode wiring pattern by flip chip connection, a common electrode on the second surface of the image array, the common electrode being connected to the common electrode wiring pattern, each of the plurality of image arrays being arranged so that the plurality of light elements face the window, a spacer connected to the first substrate and the second substrate and having a plurality of holes in which the plurality of image arrays are received, and the lens unit further comprising a perforated metal plate having a plurality of holes in which the plurality of lenses are received.

* * * * *